US006911941B2

(12) United States Patent
Tebbe et al.

(10) Patent No.: US 6,911,941 B2
(45) Date of Patent: Jun. 28, 2005

(54) DIELECTRIC SUBSTRATE WITH SELECTIVELY CONTROLLED EFFECTIVE PERMITTIVITY AND LOSS TANGENT

(75) Inventors: Dennis Tebbe, Melbourne, FL (US); Thomas Smyth, Palm Bay, FL (US); William Johnson Chappell, Lafayette, IN (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 10/465,074

(22) Filed: Jun. 19, 2003

(65) Prior Publication Data

US 2004/0257279 A1 Dec. 23, 2004

(51) Int. Cl.[7] .......................... H01Q 1/38; C03B 29/00
(52) U.S. Cl. ............................. 343/700 MS; 343/909; 156/89.11; 29/600
(58) Field of Search ...................... 343/700 MS, 756, 343/909; 333/128, 204, 108; 156/89.11, 89.12; 29/600; H01Q 1/38; C03B 29/00

(56) References Cited

U.S. PATENT DOCUMENTS

| 4,977,406 A | * | 12/1990 | Tsukamoto et al. .. 343/700 MS |
| 5,386,215 A | | 1/1995 | Brown ........................ 343/795 |
| 5,389,943 A | | 2/1995 | Brommer et al. ........... 343/909 |
| 5,402,003 A | * | 3/1995 | McIver et al. ............... 257/668 |
| 5,559,055 A | | 9/1996 | Chang et al. ................ 437/195 |
| 5,600,483 A | * | 2/1997 | Fan et al. .................... 359/245 |
| 5,744,232 A | * | 4/1998 | Bailey et al. ............... 428/323 |
| 5,855,711 A | * | 1/1999 | Araki et al. ............. 156/89.16 |
| 6,175,337 B1 | | 1/2001 | Jasper, Jr. et al. .......... 343/770 |
| 6,307,509 B1 | | 10/2001 | Krantz ................ 343/700 MS |
| 6,597,489 B1 | * | 7/2003 | Guarr et al. ................. 359/266 |
| 6,721,153 B2 | * | 4/2004 | Naito et al. .................. 361/100 |

OTHER PUBLICATIONS

Zhifang Li, John L. Volkais and Panos Y. Papalambros, "Performance enhancement of bandgap printed antennas using finite element method and size/typology optimization methods," AP2000 Millennium Conference of Antennas and Propagation, Davos, Switzerland, Apr. 9–14, 2000. <<http://citeseer.nj.nec.com/article/li00performance.html>>.

* cited by examiner

Primary Examiner—Trinh Vo Dinh
(74) Attorney, Agent, or Firm—Sacco & Associates, PA

(57) ABSTRACT

A substrate (300) for an RF device includes a plurality of layers (102) of dielectric material cofired in a stack. The plurality of layers (102) is formed from a material having a permittivity. Selected ones of the layers (102) have a pattern of perforations (106) formed in at least one perforated area (104). The perforated areas (104) are generally aligned with one another in the stack to lower one or more of an effective value of a permittivity and a loss tangent in a least one spatially defined region (504) of the substrate (300).

12 Claims, 4 Drawing Sheets

DIELECTRIC SUBSTRATE WITH SELECTIVELY CONTROLLED EFFECTIVE PERMITTIVITY AND LOSS TANGENT

STATEMENT REGARDING FEDERALLY SPONSORED RESEARCH OR DEVELOPMENT

The United States Government has rights in this invention pursuant to Contract No. F005521 between the Defense Advanced Research Projects Agency, the United States Naval Research Laboratory and Harris Corporation.

BACKGROUND OF THE INVENTION

1. Statement of the Technical Field

The invention concerns dielectric substrates for RF circuits, and more particularly dielectric substrates with effective permittivity values that can be independently controlled in predetermined portions of the substrate.

2. Description of the Related Art

The design and fabrication of microwave circuits and antennas are based on standard materials that are available for printed wiring boards or ceramic substrates. Improvements in the standard materials are incremental and tend to be infrequent. Attempts at modifying the properties of the substrates by various means have been attempted occasionally, but they have not generally resulted in any process that is practical reliable and robust.

U.S. Pat. No. 5,559,055 discloses a system for reducing the interlayer dielectric constant in a multilayer interconnect structure to increase device speed and performance. More particularly, the RC time constant of a semiconductor device is reduced by decreasing the capacitance C. The decrease in capacitance is achieved by replacing the interlayer silicon dioxide (dielectric constant of 4.0) with air (dielectric constant of 1.0). In either case, the final effective dielectric constant of the device is lowered, which results in higher device speed.

U.S. Pat. No. 6,175,337 discloses a high-gain, dielectric loaded, slotted waveguide antenna. The antenna makes use of a tailored dielectric structure in which the effective dielectric constant is incrementally or continuously reduced to have a dielectric constant close to that of the free-space value at an outer surface a distance from the waveguide array. The tailoring of the effective dielectric constant is achieved by layering a given number of slabs of different dielectric constants with sequentially reduced values, or by varying the chemical composition of the material, or by varying the density of the material imbedded with high dielectric constant particles.

Another approach to controlling the effective permittivity of a dielectric substrate is to perforate the board material in selected areas. This approach could be particularly well suited to ceramic substrates as they tend have a relatively high loss tangent and are therefore lossy. However, the perforating technique has also suffered from certain drawbacks. For example, the perforation of the substrate has tended to produce a weakened mechanical structure, particularly when the percentage of substrate material removed is high. Also, the perforations in the substrate are open to the environment and can therefore allow contaminants to collect within the structure. The conventional perforation techniques have also tended to produce dielectric substrates with effective permittivity values that are not consistent at each measurable point on the surface.

Another disadvantage of conventional perforated substrate system is that simply perforating the substrate will produce openings on both sides of the board. This interferes with the RF circuitry disposed on the substrate. Perforations can be drilled only partially through the substrate material to leave a continuous surface on at least one side. For example, laser drilling can be used for this purpose. However, difficulties are encountered in controlling the accuracy of the laser drilling process. In particular, it is difficult to precisely control the depth of drilled perforations so as to maintain a stable value of permittivity and loss tangent across the surface of the perforated area. Moreover, the drilling process leaves the internal structure of the substrate exposed on at least one side of the board.

SUMMARY OF THE INVENTION

The invention concerns a method for fabricating a substrate for an RF device. The method includes the steps of forming a pattern of perforations in a plurality of layers of a dielectric material in at least one perforated area of each layer and arranging the plurality of layers in a stack. At least one perforated area in each of the plurality of layers is at least partially aligned with another perforated area of another layer in the stack to lower an effective value of permittivity and an effective value of a loss tangent in a least one spatially defined region of the substrate, as compared to a bulk value of permittivity and loss tangent for the dielectric material. The layers can be formed from a low temperature cofired ceramic tape or a high temperature cofired ceramic tape. The method can also include the step of firing the stack and forming an RF circuit component on the substrate in the spatially defined region. The pattern of perforations can be excluded from one or more outer layers of the substrate to seal the inner perforations from dust and contamination.

According to one aspect of the invention, the perforation pattern for each of the plurality of layers can be selected so that the effective value of permittivity is substantially the same at each measurable point of the spatially defined region of the substrate. Further, the pattern can be varied among the plurality of layers to ensure structural rigidity and a final substrate with a planar outer surface. For example, the pattern can be offset from layer to layer.

According to another aspect of the invention, the method can also include selecting the pattern of perforations in the plurality of perforated areas to produce different values for the effective permittivity in a plurality of the spatially defined regions on the substrate. Alternatively, the pattern of perforations in each of the layers can be selected so as to cause the effective permittivity to selectively vary in a predetermined manner across a surface of the substrate defined by the spatially defined region.

The invention also concerns a substrate for an RF device. The substrate is comprised of a plurality of layers of dielectric material cofired in a stack. Each of the plurality of layers is formed from a material having a permittivity and having a pattern of perforations formed in at least one perforated area. The perforated areas of each respective one of the layers is advantageously aligned at least partially with associated perforated areas in adjacent layers to lower an effective value of a permittivity and an effective loss tangent in one or more spatially defined regions of the substrate. The substrate layers can be comprised of a high temperature cofired ceramic tape or a low temperature cofired ceramic tape.

DETAILED DESCRIPTION OF THE PREFERRED EMBODIMENT

Figure 1:
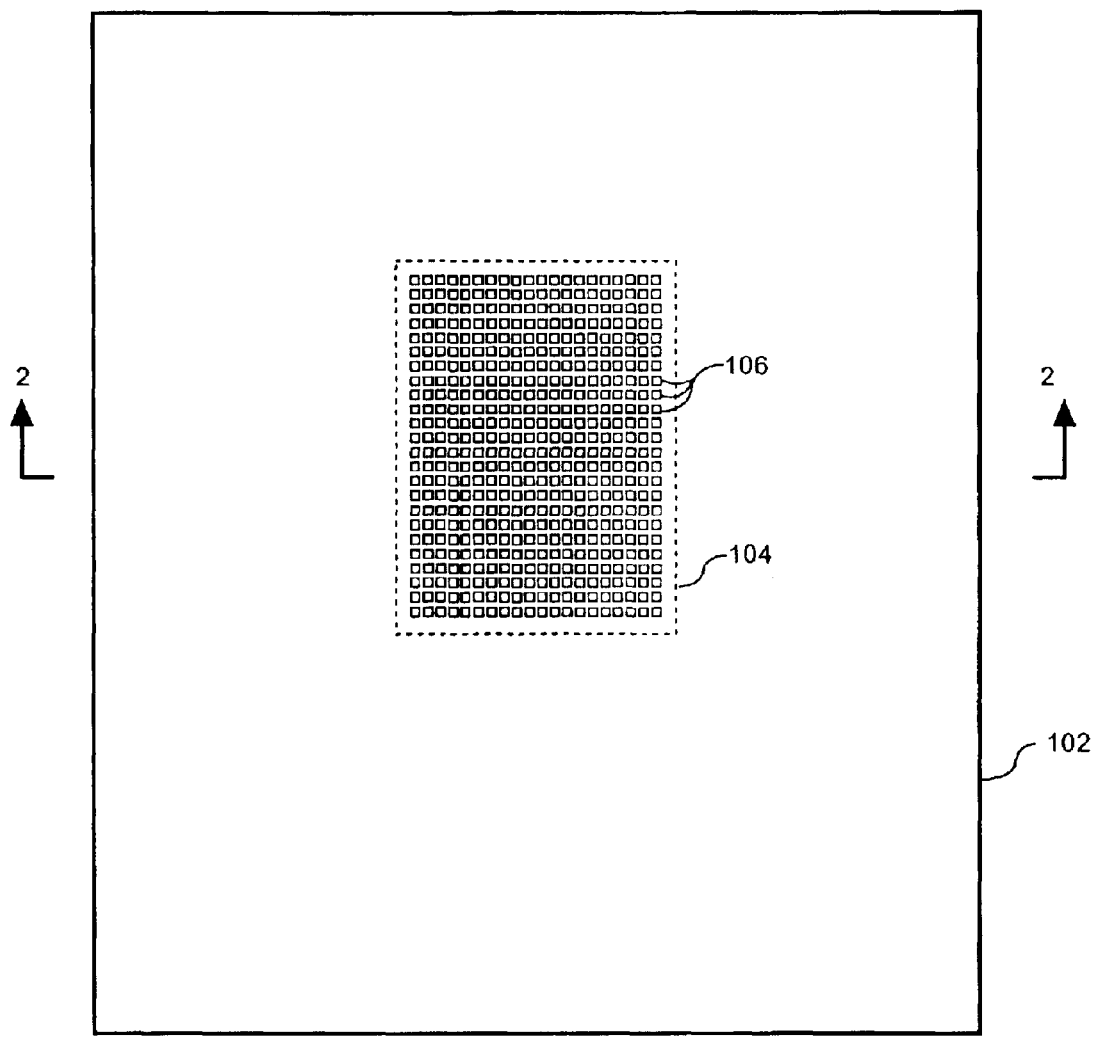
FIG. 1 is a top view of a single layer of a dielectric material that can be used to construct a substrate with selectively controlled effective permittivity.
Figure 2:
FIG. 2 is a cross-sectional view of the single layer of dielectric material taken along line 2—2 in FIG. 1.
Figure 3:
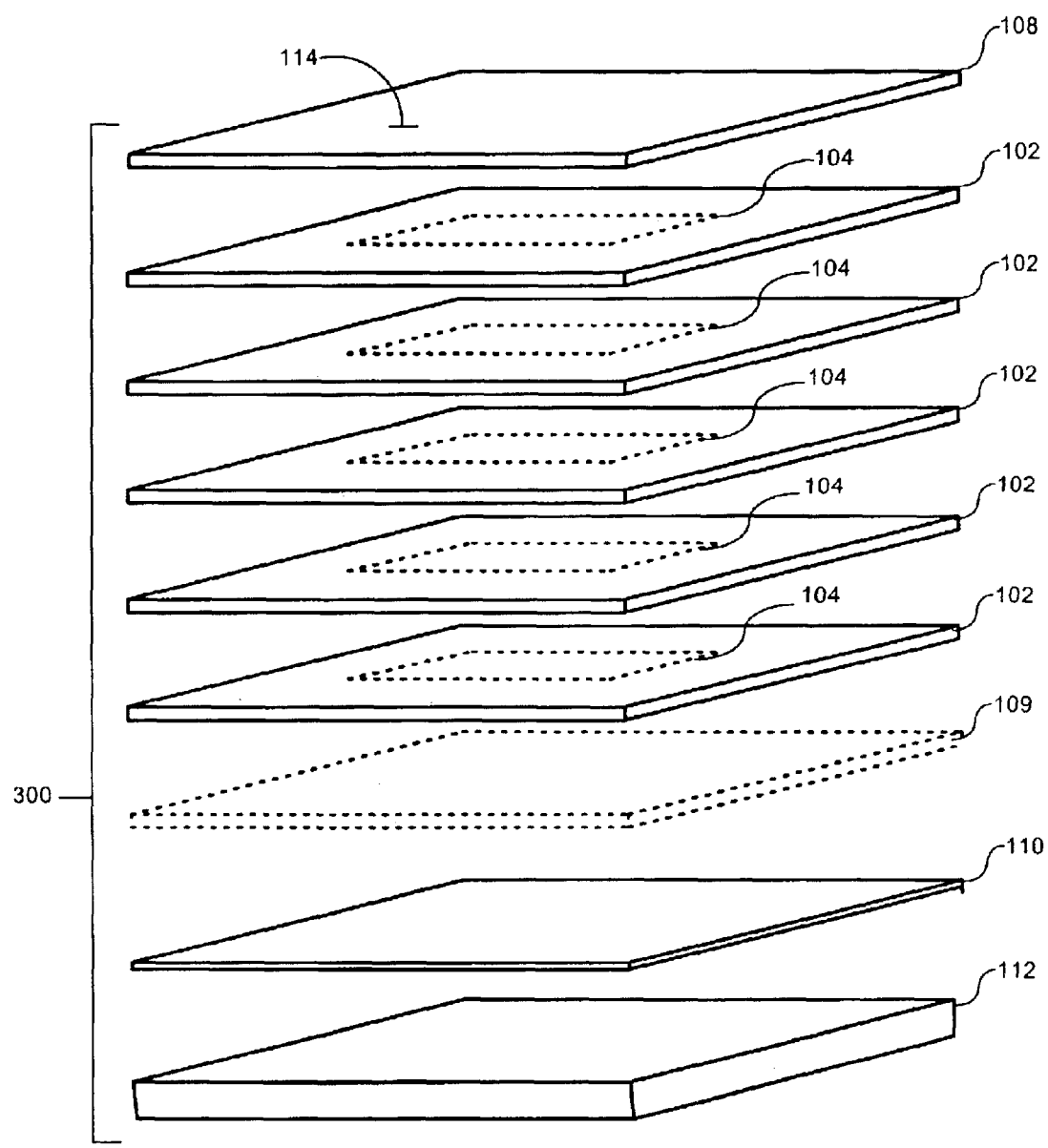
FIG. 3 is a drawing that is useful for understanding the assembly of a substrate.

Referring to FIGS. 1–3, a process is illustrated for manufacturing a laminated substrate formed from a plurality of layers 102 having defined areas with selectively controlled values of permittivity and loss tangent. FIG. 1 is a top view of a layer 102 formed of a dielectric material that can be used to construct the substrate 300 shown in FIG. 3. A cross-sectional view of the single layer 102, taken along line 2—2, is shown in FIG. 2.

The layer 102 is preferably formed from an unfired ceramic tape. According to a preferred embodiment, the layer 102 can be comprised of a low or high temperature type cofired glass/ceramic tape. Glass/ceramic tapes such as those described herein are well known in the art. For example, low temperature 951 cofire Green Tape™ can be used for this purpose. Green Tape™ is Au and Ag compatible, has acceptable mechanical properties with regard to thermal coefficient of expansion (TCE) and relative strength. It is available in thicknesses ranging from 114 $\mu$m to 254 $\mu$m and is designed for use as an insulating layer in hybrid circuits, multichip modules, single chip packages, and ceramic printed wire boards, including RF circuit boards. Low temperature 951 cofire Green Tape™ is available from The DuPont Company's Microcircuit Materials division which is located at 14 T. W. Alexander Drive, Research Triangle Park, N.C.

As used herein, the reference to low temperature cofired ceramics refers to ceramics that can be fired at relatively low temperatures. For example, firing temperatures for such material range are typically less than about 850 degrees Centigrade. By comparison, high temperature ceramics are typically fired at temperatures in excess of 1500 degrees Centigrade.

A typical electronic circuit module can be made with Green Tape by cutting tape foil to size, punching vias and filling same with thick film conductive paste. Subsequently, the conductive interconnect lines are patterned on the tape. The operation is repeated multiple times if additional layers are required. After all of the individual layers are complete, they can be collated, stacked, and laminated. At this point the stacked layers are commonly referred to as a "green" multilayer. Using standard processing techniques, the multilayer is fired and cut to size. Finally, the top layer is completed by forming resistors, and gold and silver bearing conductors.

Although low and high temperature cofired glass/ceramic substrates are preferred for use in the present invention, it should be noted that other dielectric substrate layers can also be used and the invention is not intended to be limited in this regard. A preferred thickness of the layers 102 is presently between about 100 $\mu$m to 300 $\mu$m, but it should be understood that layers that are thinner or thicker can also be used.

According to a preferred embodiment of the invention illustrated in FIGS. 1 and 2, each layer 102 can have one or more perforated areas 104 which are formed with a pattern of very small perforations 106. At least one perforated area in each of the layers 102 is preferably at least partially aligned with at least one other perforated area of another layer 102 in the stack. This will lower an effective value of a permittivity and an effective value of a loss tangent in a spatially defined region of the substrate coincident with the aligned portion of the perforated areas as compared to a bulk value of permittivity and loss tangent for the dielectric material. Perforated areas are considered to be at least partially aligned when at least a portion of a perforated area 104 for a layer 102 overlaps at least a portion of a second perforated area of another layer in the stack.

The perforations 106 are preferably formed in each layer 102 while the layer is still in the pre-fired state. The pattern, size, shape and spacing of the perforations 106 are selected to adjust the effective permittivity and effective loss tangent in the perforated areas. The shape of the perforations is not critical to the invention. However, square perforations are presently preferred relative to circular perforations because of the larger amount of material that can be effectively removed while still maintaining structural integrity of the layer. If the perforations 106 have a square outline, they can be in the range of about 0.004 inches to 0.2 inches on each side, depending on the wavelength of the RF signals of interest in a particular application. In general, the size of the perforations is preferably no larger than about $\frac{1}{10}\lambda$ to $\frac{1}{50}\lambda$, where $\lambda$ is equal to one wavelength at the frequency of interest. The relative size selected will be dependent somewhat on the frequency of interest and fabrication limits. For example, at lower frequencies and/or with improved fabrication techniques, perforations less than $\frac{1}{50}\lambda$ are possible. In fact, the concept works for any size scale below the previously mention $\frac{1}{10}\lambda$ limit and can be realized even down to the nanoscale level with the same bulk properties.

The perforations 106 can be formed by punching or drilling each layer separately using commercially available equipment. According to a preferred embodiment, commercially available precision computer controlled high speed punching equipment can be used for this purpose. For example, the perforations can be formed using an MP 4150 type automated punch available from Unichem Industries, Inc. of San Clemente, Calif. Computer controlled high speed punching equipment is preferred for this process because the pattern of perforations 106 in perforated area 104 can vary somewhat from layer to layer. For example, the arrangement of perforations, their spacing and shape may be varied. Alternatively, the perforations can be vertically aligned or can be simply offset slightly from one layer to the next while maintaining essentially the same pattern.

It is possible for the perforation pattern in layers 102 to be varied from layer to layer or they may be aligned directly with the perforations in the layer above and below without affecting the planarity of the top or bottom surface. Structural rigidity is retained by applying either approach to arranging the perforated layers.

The effective permittivity of the perforated area generally decreases linearly as more substrate is removed. Significantly, however, it has been found that the effective loss tangent for the perforated area 104 will decrease rapidly, and in a non-linear fashion, as the percentage of material comprising layer 102 that is removed ranges from about 60% to 90%. The optimal volume of substrate removed will depend upon a variety of factors. For example, consideration must be given to the increasing fragility of the structure as larger amounts of material are removed. Also, care must be taken so that the perforated area 104 does not create a non-planar outermost surface 114 when the layers 102 are arranged in a stack.

Referring again to FIG. 3, at least one outermost dielectric layer 108 can be formed from the same material as the layers 102 and added to the stack of layers 102 as shown. However, the outer dielectric layer 108 is preferably devoid of perforated areas 104. In this way, the outer dielectric layer 108 can act as a sealing layer to prevent the intrusion of dust, moisture and other contaminants into the perforations 106 in the layers 102. Depending upon the electrical and mechanical requirements for a particular application, it can be desirable to include multiple dielectric layers 108. The additional layers can provide increased rigidity and mechanical strength as may be required depending upon the intended use and environment (such as shock and vibration). Once all of the dielectric layers have been arranged in a stack, they can be fired in a manner consistent with the requirements of the particular type of layer material.

After firing, the stack of layers 102, 108 can be arranged on a base 112. According to a preferred embodiment, base 112 is a conductive sheet or foil. For example copper sheet can be used for this purpose. However, it should be understood that the invention is not so limited and a rigid dielectric or semiconductor material can also be used to form base 112. An adhesive layer 110 is preferably provided between the layers 102 and the base 112 to secure the stack of dielectric layers to the base 112. Adhesive layer 110 is preferably a conductive adhesive. For example an electronic grade conductive film adhesive can be used for this purpose. Such adhesive is typically a silver filled epoxy with 70% silver particles. Adhesives of this type are commercially available and can be cured at relatively low temperatures. For example, typical curing times are about 125 degrees centigrade for about 2 hours in a low temperature cure oven. Curing time will vary depending on the particular adhesive material that is selected.

Once the cured stack of layers 102, 108 have been placed on the adhesive 110, they are preferably maintained in a stationary position until the adhesive has cured. Sliding or moving the perforated layers 102 can cause the conductive adhesive to be inadvertently forced up into the perforations 106, thereby negatively affecting the electrical performance of the substrate 300. According to an alternative embodiment, one or more solid dielectric layers 109 made from the same material as layers 102 but without any perforations can optionally be interposed between the lowermost layer 102 and adhesive layer 110. The solid dielectric layer 109 can be used to prevent the unwanted intrusion of the adhesive layer 110 into the perforations 106. Also, such layers can be desirable for improved mechanical properties as may be necessary depending upon the intended use and environmental conditions.

Figure 4:
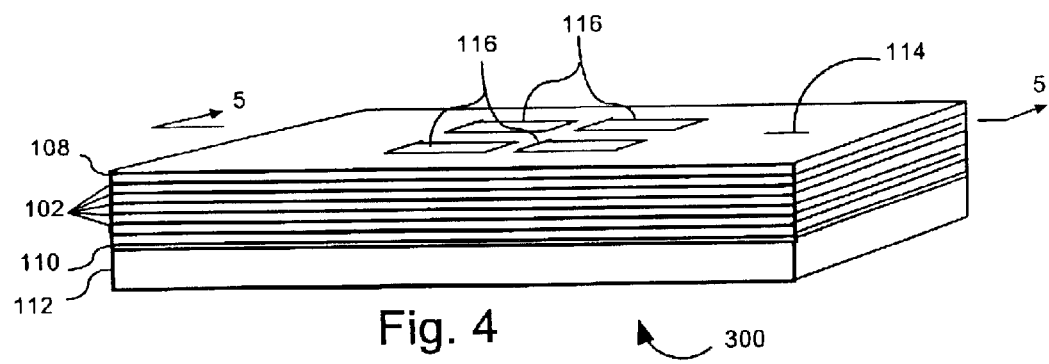
FIG. 4 is a perspective view of the completed substrate.
Figure 5:
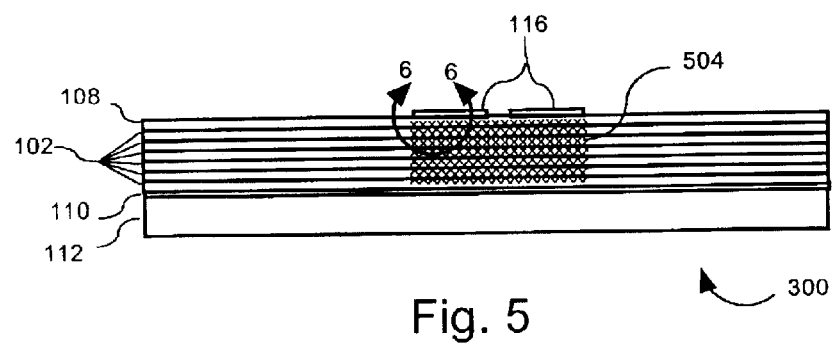
FIG. 5 is a cross-sectional view of the completed substrate taken along line 5—5 in FIG. 4.

FIG. 4 is a cross-sectional view of a completed substrate 300 with selectively controlled permittivity. FIG. 5 is a cross-sectional view through substrate 300 taken along line 5—5. The substrate 300 includes one or more spatially defined regions 504 that have a lower effective value of permittivity and a lower effective value of loss tangent, as compared to a bulk value of permittivity and loss tangent for the dielectric material comprising the layers 102, 108. The lower values are due to the selective removal of dielectric material as shown.

Figure 6A:
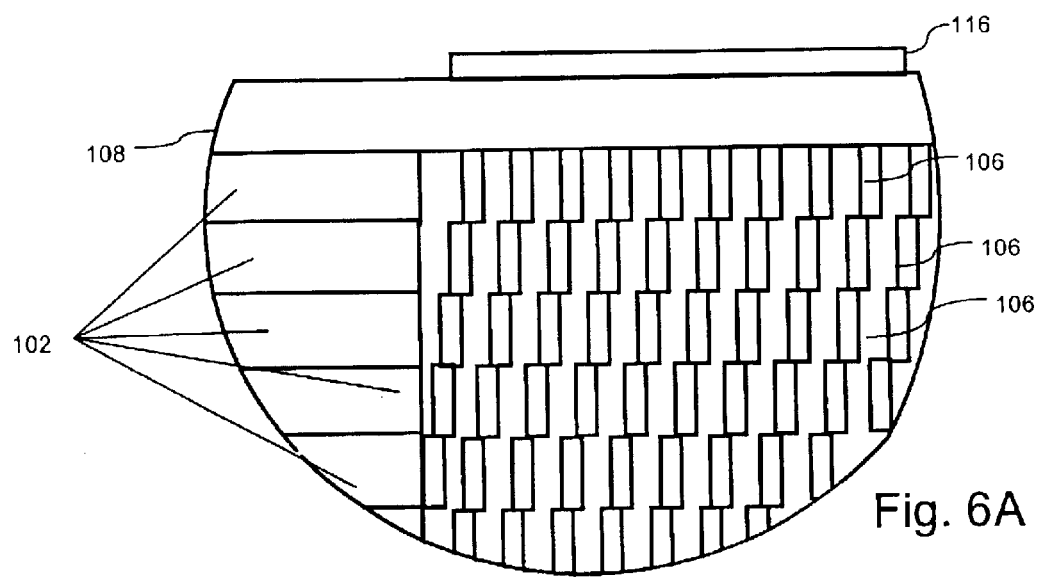
FIG. 6A is an enlarged cross-sectional view of a portion of the completed substrate in the area 6—6 in FIG. 5 showing vertically staggered perforations.
Figure 6B:
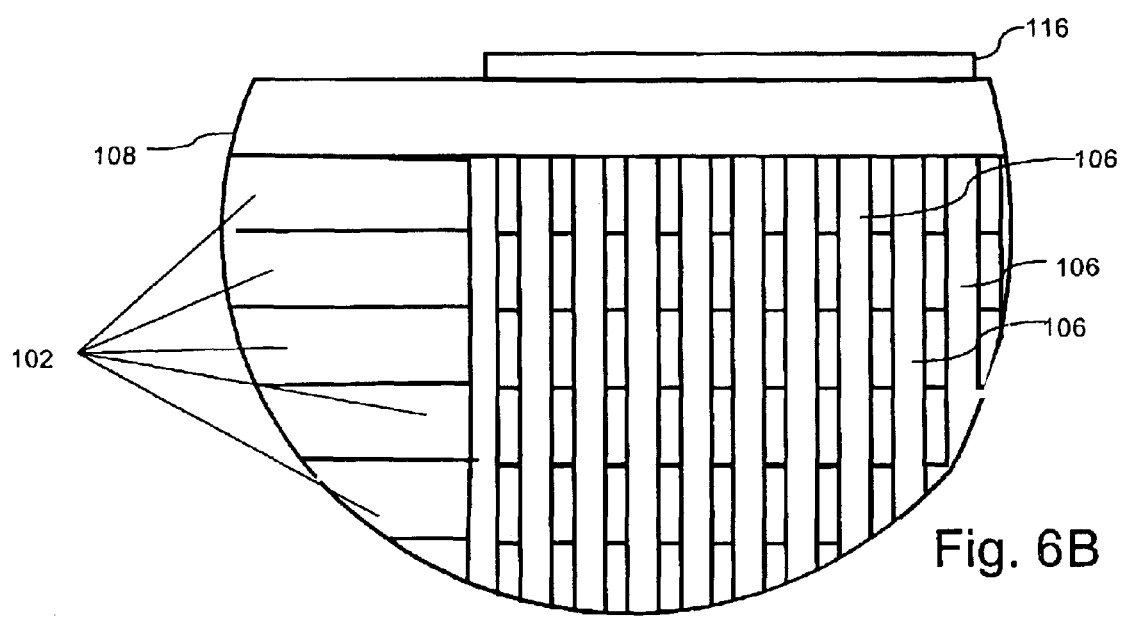
FIG. 6B is an enlarged cross-sectional view of a portion of the completed substrate in the area 6—6 in FIG. 5 showing vertically aligned perforations.

FIG. 6a is an enlarged view of a portion of FIG. 5 defined by line 6—6 showing an offset perforation pattern from one layer 102 to the next layer 102 as previously described. Notably, this can result in vertically staggered perforations as shown. However, the invention is not limited in this regard, and it is also possible to form perforated areas that make use of a consistent pattern from one layer to the next so as to produce vertically aligned perforations as illustrated in FIG. 6B. In yet another embodiment, the patterns can vary from layer to layer while remaining within the perforated area of each layer 102.

Conductive elements 116 can be screen printed on outermost layer 108 on an area of outermost layer 108 extending over spatially defined region 504. The screen printing on the array is typically an electronics grade conductive epoxy or ink that cures in the 100 degree to 125 degree range. The conductive elements 116 can comprise any of a wide variety of RF elements that have an electrical characteristic modified as a result of the modified permittivity and/or loss tangent of the spatially defined region 504. For example, and without limitation, conductive elements 116 can be antenna elements associated with an array, filter elements, transmission line elements, transformer elements, stubs, and so on.

The foregoing process offers great flexibility for RF designers without requiring costly changes to conventional processing methods. Having made the fundamental choice of the dielectric thickness, selected portions of the substrate can now be specifically tailored to achieve the desired dielectric properties. The flexibility of this approach gives the RF designer almost unlimited control over effective permittivity and effective loss tangent without changing processing steps.

According to one aspect of the invention, the perforation pattern for each of the plurality of layers can be selected so that the effective value of permittivity is substantially the same at each measurable point of the spatially defined region of the substrate. Further, a multiplicity of spatially defined regions 504 can be defined within the substrate, each with either the same or different effective values of permittivity and loss tangent. Alternatively, the pattern of perforations in each of the layers 102 can be selected so as to cause the effective permittivity and loss tangent to selectively vary in a predetermined manner across the surface 114 of the substrate defined by the spatially defined region. This can include varying the perforation size, perforation shape and/or perforation spacing within the perforated area 104 of one or more layers 102. For example, progressively more or less dielectric material can be removed from one or more layers 102 along a particular direction defined along the surface 114 so as to cause the permittivity and loss tangent to decrease or increase in a predetermined manner. In any case, the perforation pattern can be varied among the plurality of layers to ensure structural rigidity and a final substrate 300 with a planar outer surface 114.

We claim:

1. A method for fabricating a substrate for an RF device, comprising steps of:

forming a pattern of perforations in a plurality of layers of an unfired ceramic tape in at least one perforated area of each layer;

laminating said plurality of layers in a stack with said at least one perforated area in each of said plurality of layers at least partially aligned with at least one perforated area of an adjacent one of said plurality of layers in said stack to lower at least one of an effective value of a permittivity and an effective value of a loss tangent in a least one spatially defined region of said substrate, as compared to a bulk value of permittivity and loss tangent for said dielectric material;

firing said laminated stack.

2. The method according to claim 1 further comprising a step of aligning said perforations of each said perforated area.

3. The method according to claim 1 further comprising a step of selecting said ceramic tape to be a low temperature cofired ceramic tape.

4. The method according to claim 1 further comprising a step of forming an RF circuit component on said substrate.

5. The method according to claim 1 further comprising a step of excluding said pattern of perforations from at least one outermost layer of said substrate.

6. A method for fabricating a substrate for an RF device, comprising steps of:

forming a pattern of perforations in a plurality of layers of a dielectric material in at least one perforated area of each layer;

arranging said plurality of layers in a stack with said at least one perforated area in each of said plurality of layers at least partially aligned with one another in said stack to lower at least one of an effective value of a permittivity and an effective value of a loss tangent in a least one spatially defined region of said substrate, as compared to a bulk value of permittivity and loss tangent for said dielectric material;

selecting said pattern for each of said plurality of layers so that said effective value of permittivity is substantially the same at each measurable point of said spatially defined region of said substrate.

7. The method according to claim 1 further comprising a step of varying said pattern among said plurality of layers.

8. The method according to claim 1 further comprising a step of off setting said pattern from layer to layer.

9. The method according to claim 1 further comprising a step of sealing said spatially defined region from an external environment.

10. The method according to claim 1 further comprising a step of forming said pattern of perforations in a plurality of said perforated areas of each said layer to produce a plurality of said spatially defined regions, each having said effective value of permittivity lower than said permittivity.

11. A method for fabricating a substrate for an RF device, comprising steps of:

forming a pattern of perforations in a plurality of layers of a dielectric material in at least one perforated area of each layer;

arranging said plurality of layers in a stack with said at least one perforated area in each of said plurality of layers at least partially aligned with one another in said stack to lower at least one of an effective value of a permittivity and an effective value of a loss tangent in a least one spatially defined region of said substrate, as compared to a bulk value of permittivity and loss tangent for said dielectric material;

forming said pattern of perforations in a plurality of said perforated areas of each said layer to produce a plurality of said spatially defined regions, each having said effective value of permittivity lower than said permittivity;

selecting said pattern of perforations in said plurality of perforated areas to produce a value for said effective permittivity in said plurality of said spatially defined regions that is different as compared to areas of said layers that are not perforated.

12. A method for fabricating a substrate for an RF device, comprising steps of:

forming a pattern of perforations in a plurality of layers of a dielectric material in at least one perforated area of each layer;

arranging said plurality of layers in a stack with said at least one perforated area in each of said plurality of layers at least partially aligned with one another in said stack to lower at least one of an effective value of a permittivity and an effective value of a loss tangent in a least one spatially defined region of said substrate, as compared to a bulk value of permittivity and loss tangent for said dielectric material;

selecting said pattern of perforations in each of said layers to cause said effective permittivity to selectively vary in a predetermined manner across a surface of said substrate defined by said spatially defined region.

* * * * *